(12) United States Patent
Jarrahi et al.

(10) Patent No.: US 12,140,477 B2
(45) Date of Patent: Nov. 12, 2024

(54) SYSTEM AND METHOD FOR PHOTOMIXER-BASED HETERODYNE HIGH-FREQUENCY SPECTROMETER AND RECEIVER

(71) Applicant: The Regents of the University of California, Oakland, CA (US)

(72) Inventors: Mona Jarrahi, Los Angeles, CA (US); Ning Wang, Mountain View, CA (US)

(73) Assignee: The Regents of the University of California, Oakland, CA (US)

( * ) Notice: Subject to any disclaimer, the term of this patent is extended or adjusted under 35 U.S.C. 154(b) by 952 days.

(21) Appl. No.: 17/044,486

(22) PCT Filed: Apr. 1, 2019

(86) PCT No.: PCT/US2019/025131
§ 371 (c)(1),
(2) Date: Oct. 1, 2020

(87) PCT Pub. No.: WO2019/195140
PCT Pub. Date: Oct. 10, 2019

(65) Prior Publication Data
US 2021/0041296 A1 Feb. 11, 2021

Related U.S. Application Data

(60) Provisional application No. 62/651,610, filed on Apr. 2, 2018.

(51) Int. Cl.
*G01J 3/433* (2006.01)
*H01Q 9/16* (2006.01)
(52) U.S. Cl.
CPC .............. *G01J 3/4338* (2013.01); *H01Q 9/16* (2013.01)

(58) Field of Classification Search
CPC ................................ G01J 3/4338; G01J 3/42
See application file for complete search history.

(56) References Cited

U.S. PATENT DOCUMENTS 9,400,214 B1 7/2016 Demers
9,804,026 B2 10/2017 Jarrahi
(Continued)

OTHER PUBLICATIONS

Wang et al., "Heterodyne Terahertz Detection with Plasmonic Photomixers", 2016 IEEE MTT-S International Microwave Symposium (IMS), pp. 1-3, (downloaded Aug. 25, 2023). (Year: 2016).*
(Continued)

*Primary Examiner* — David P Porta
*Assistant Examiner* — Casey Bryant
(74) *Attorney, Agent, or Firm* — Quarles & Brady LLP

(57) ABSTRACT

A system for detecting high-frequency radiation that offers near-quantum-limited sensitivity, broad spectral bandwidth, and high spectral resolution while operating at room temperature. The system can include an antenna assembly configured to receive at least a high-frequency radiation and a substrate comprising a semiconductor material with a contact-semiconductor interface connected to the antenna assembly. The system also includes an optical pump configured to produce an optical beam that has a high-frequency beat frequency, the optical beam contacting the contact-semiconductor interface to create an intermediate frequency signal by combining the optical beam with the high-frequency radiation. The system further includes a detector configured to detect the intermediate frequency and generate at least one report indicating the received, high-frequency radiation.

20 Claims, 11 Drawing Sheets

(56) References Cited

U.S. PATENT DOCUMENTS

| | | |
|---|---|---|
| 2006/0152412 A1 | 7/2006 | Evans et al. |
| 2009/0066948 A1 | 3/2009 | Karpowicz |
| 2011/0062336 A1 | 3/2011 | Ben-Bassat |
| 2012/0044479 A1 | 2/2012 | Roulston |
| 2017/0123292 A1 | 5/2017 | Jarrahi |

OTHER PUBLICATIONS

Wang et al., "Plasmonic Heterodyne Terahertz Spectrometry", Cleo: Science and Innovations 2018, pp. 1-2. (Year: 2018).*

Miao et al. "Simulation of an Integrated Log-Spiral Antenna at Terahertz", 2008 8th International Symposium on Antennas, Propagation and EM Theory. (Year: 2008).*

Berry, C. W., et al. "Significant performance enhancement in photoconductive terahertz optoelectronics by incorporating plasmonic contact electrodes." Nature communications 4 (2013): 1622.

Biver, N., et al. "Evolution of the outgassing of Comet Hale-Bopp (C/1995 O1) from radio observations." Science 275.5308 (1997): 1915-1918.

Brünken, S., et al. "H 2 D+ observations give an age of at least one million years for a cloud core forming Sun-like stars." Nature 516.7530 (2014): 219-221.

Chattopadhyay, G. "Sensor technology at submillimeter wavelengths for space applications." International Journal on Smart Sensing and Intelligent Systems, 1, 1-20, 2008.

De Graauw, T, et al. "The Herschel-heterodyne instrument for the far-infrared (HIFI)." Astronomy & Astrophysics 518 (2010): L6.

Dutrey, A., et al. "Chemistry of protosolar-like nebulae: The molecular content of the DM Tau and GG Tau disks." Astronomy and Astrophysics 317 (1997): L55-L58.

Falgarone, E., et al. "Large turbulent reservoirs of cold molecular gas around high-redshift starburst galaxies." Nature 548.7668 (2017): 430-433.

Hartogh, P., et al. "Ocean-like water in the Jupiter-family comet 103P/Hartley 2." Nature 478.7368 (2011): 218-220.

Heyminck, S., et al. "Great: the Sofia high-frequency heterodyne instrument." Astronomy & Astrophysics 542 (2012): L1.

Hogerheijde, M. R., et al. "Detection of the water reservoir in a forming planetary system." Science 334.6054 (2011): 338-340.

Hubers, H.-W. "Terahertz heterodyne receivers." IEEE journal of selected topics in quantum electronics 14.2 (2008): 378-391.

International Searching Authority. International Search Report and Written Opinion for application PCT/US2018/025131. Mailed on Jun. 14, 2019. 11 pages.

Kerr, A. R. "Suggestions for revised definitions of noise quantities, including quantum effects." IEEE transactions on microwave theory and techniques 47.3 (1999): 325-329.

Küppers, M., et al. "Localized sources of water vapour on the dwarf planet (1) Ceres." Nature 505.7484 (2014): 525-527.

Mahieu, E. et al. "Recent Northern Hemisphere stratospheric HCl increase due to atmospheric circulation changes." Nature 515.7525 (2014): 104-107.

Manney, G. L., et al. "Unprecedented Arctic ozone loss in 2011." Nature 478.7370 (2011): 469-475.

Neugebauer, G., et al. "Early results from the infrared astronomical satellite." Science 224.4644 (1984): 14-21.

Phillips, T. G., et al. "Submillimeter astronomy (heterodyne spectroscopy)." Proceedings of the IEEE 80.11 (1992): 1662-1678.

Semenov, A. D., et al. "Superconducting hot-electron bolometer mixer for terahertz heterodyne receivers." IEEE transactions on applied superconductivity 13.2 (2003): 168-171.

Solomon, S., et al. "Contributions of stratospheric water vapor to decadal changes in the rate of global warming." Science 327.5970 (2010): 1219-1223.

Van Dishoeck, E. F., et al. "Chemical Evolution of Star-Forming Regions." Annu. Rev. Astron. Astrophys 36 (1998): 317-68.

Wang, N. et al. "Noise analysis of photoconductive terahertz detectors." Journal of Infrared, Millimeter, and Terahertz Waves 34.9 (2013): 519-528.

Wang, N. et al. "Broadband Heterodyne Terahertz Detector Based on Plasmonic Photomixing," Proc. International Conference on Infrared, Millimeter, and Terahertz Waves, Copenhagen, Denmark, Sep. 25-30, 2016.

Wang, N. et al. "Heterodyne Terahertz Detection through Plasmonic Photomixing," Proc. European Conference on Antennas and Propagation, Davos, Switzerland, Apr. 11-15, 2016.

Wang, N. et al. "Heterodyne Terahertz Detection with Plasmonic Photomixers," IEEE Microwave Symposium Digest, San Francisco, CA, May 22-27, 2016.

Wang, N. et al. "Heterodyne Terahertz Detectors based on Plasmonic Photomixers," Proc. Conference of Lasers and Electro-Optics, San Jose, CA, Jun. 5-10, 2016.

Roser, H-P. "Heterodyne spectroscopy for submillimeter and far-infrared wavelengths from 100 μm to 500 μm." Infrared physics 32 (1991): 385-407.

Wang, N. et al. "High-performance Heterodyne Terahertz Receivers based on Plasmonic Photomixing Antennas," Proc. IEEE International Antennas and Propagation Symposium, Fajardo, Puerto Rico, Jun. 26-Jul. 1, 2016.

Wang, N. et al. "Large Dynamic Range Terahertz Spectrometers based on Plasmonic Photomixers," Proc. SPIE Photonic West, San Francisco, CA, Jan. 28-Feb. 2, 2017. Abstract.

Wang, N. et al. "Large-dynamic-range plasmonic photomixer for heterodyne terahertz detection," Proc. SPIE Photonic West, San Francisco, CA, Feb. 13-18, 2016.

Wootten, A. et al. "The Atacama large millimeter/submillimeter array." Proceedings of the IEEE 97.8 (2009): 1463-1471.

Yang, S. H., et al. (2015). Spectral characteristics of terahertz radiation from plasmonic photomixers. Optics express, 23(22), 28522-28530.

Zmuidzinas, J. et al. "Superconducting Detectors and Mixers for Millimeter and Submillimeter Astrophysics," Proc. IEEE, vol. 92, pp. 1597-1616, 2004.

European Patent Office, Extended European Search Report, Application No. 19780826.4, Sep. 28, 2021, 7 pages.

European Patent Office, Communication Pursuant to Article 94(3) EPC, Application No. 19780826.4, Aug. 29, 2023, 6 pages.

* cited by examiner

SYSTEM AND METHOD FOR PHOTOMIXER-BASED HETERODYNE HIGH-FREQUENCY SPECTROMETER AND RECEIVER

CROSS-REFERENCE TO RELATED APPLICATIONS

The present application represents the national stage entry of International Application PCT/US2019/025131, filed Apr. 1, 2019, which claims the benefit of U.S. Provisional Application Ser. No. 62/651,610, filed on Apr. 2, 2018, which is incorporated herein by reference in its entirety.

STATEMENT REGARDING FEDERALLY SPONSORED RESEARCH

This invention was made with government support under N00014-14-1-0573, awarded by the U.S. Navy, Office of Naval Research, and 1305931, awarded by the National Science Foundation. The government has certain rights in the invention.

BACKGROUND

Our universe is most radiant at terahertz frequencies (e.g., 0.1-10 THz), providing critical information on the formation of the planets, stars, and galaxies, as well as the atmospheric constituents of the planets, their moons, comets and asteroids. The detection of faint fluxes of photons at terahertz frequencies is crucial for many planetary, cosmological, and astrophysical studies. For example, understanding the physics and molecular chemistry of the life cycle of stars and their relation with the interstellar medium in galaxies requires instruments with noise temperatures close to the quantum limit.

Photon detection with near-quantum-limited sensitivity is particularly challenging in the terahertz regime, which contains roughly 98% of all the photons existing in the universe. Near-quantum-limited terahertz spectrometry has so far only been possible through the use of cryogenically cooled superconducting mixers as frequency downconverters.

Traditional heterodyne terahertz spectrometers based on cryogenically cooled superconducting mixers have been the key enablers in astrophysics, cosmology, and atmospheric studies, providing essential high spectral resolution and detection sensitivity levels. However, the operation temperature and bandwidth constraints of prior systems have limited their usage in many scientific explorations.

Thus, it would be desirable to have systems and methods for an improved terahertz spectrometer capable of providing near-quantum-limited sensitivities, for example, at room temperature.

SUMMARY

The present disclosure overcomes the aforementioned drawbacks by providing systems and methods for a high-frequency spectrometer that can offer near-quantum-limited sensitivity, broad spectral bandwidth, and high spectral resolution, while operating at non-cryogenically cooled temperatures, including near or at room temperatures. In one non-limiting implementation, the systems and methods can utilize plasmonic photomixers as frequency downconverters to achieve such improvements. Such frequency downconversion can be achieved by mixing terahertz radiation and a heterodyning optical beam having a terahertz beat frequency.

With a flexible design capable of broadband high-frequency spectrometry, the systems and methods of the present disclosure have broad applicability to astronomy, cosmology, atmospheric studies, quantum optics, high-frequency measurement equipment, biological studies, and multi-spectral imaging. For example, the spectrometer can be used as a highly-efficient heterodyne receiver in many communication, radar, and remote sensing applications.

In one aspect, the present disclosure provides a system for detecting high-frequency radiation. The system includes an antenna assembly configured to receive at least a high-frequency radiation and a substrate comprising a semiconductor material with a contact-semiconductor interface connected to the antenna assembly. The system also includes an optical pump configured to produce an optical beam that has a high-frequency beat frequency, the optical beam contacting the contact-semiconductor interface to create an intermediate frequency signal by combining the optical beam with the high-frequency radiation. The system further includes a detector configured to detect the intermediate frequency and generate at least one report indicating the received, high-frequency radiation.

In another aspect, the present disclosure provides a method for detecting high-frequency radiation. The method comprises receiving radiation in a range of 50 GHz-10 THz, producing a heterodyning optical beam with a terahertz beat frequency, creating an intermediate frequency signal by combining the optical beam with the high-frequency radiation using a photomixer, and detecting the intermediate frequency signal.

In yet another aspect, the present disclosure provides a method for detecting high-frequency radiation. The method comprises receiving high-frequency radiation using a lens, producing a heterodyning optical beam that has a high-frequency beat frequency using an optical pump, creating an intermediate frequency signal by combining the optical beam with the high-frequency radiation using a photomixer, detecting the intermediate frequency signal; and generating a report of the high-frequency radiation from the detected intermediate frequency signal.

The foregoing and other aspects and advantages of the invention will appear from the following description. In the description, reference is made to the accompanying drawings that form a part hereof, and in which there is shown by way of illustration a preferred embodiment of the invention. Such an embodiment does not necessarily represent the full scope of the invention, however, and reference is made therefore to the claims and herein for interpreting the scope of the invention.

DETAILED DESCRIPTION

As will be described, the present disclosure provides systems and methods for detecting high-frequency radiation. For example, high-frequency may refer to, for example, 50 GHz-10 THz or terahertz ranges, generally. The presented system, also referred to as high-frequency or terahertz spectrometer, offers transformative advantages over conventional techniques, which previously utilized a Schottky diode, hot electron bolometer (HEB), or a superconductor-insulator-superconductor (SIS) mixer together with a terahertz local oscillator for THz-to-RF downconversion.

Figure 1:
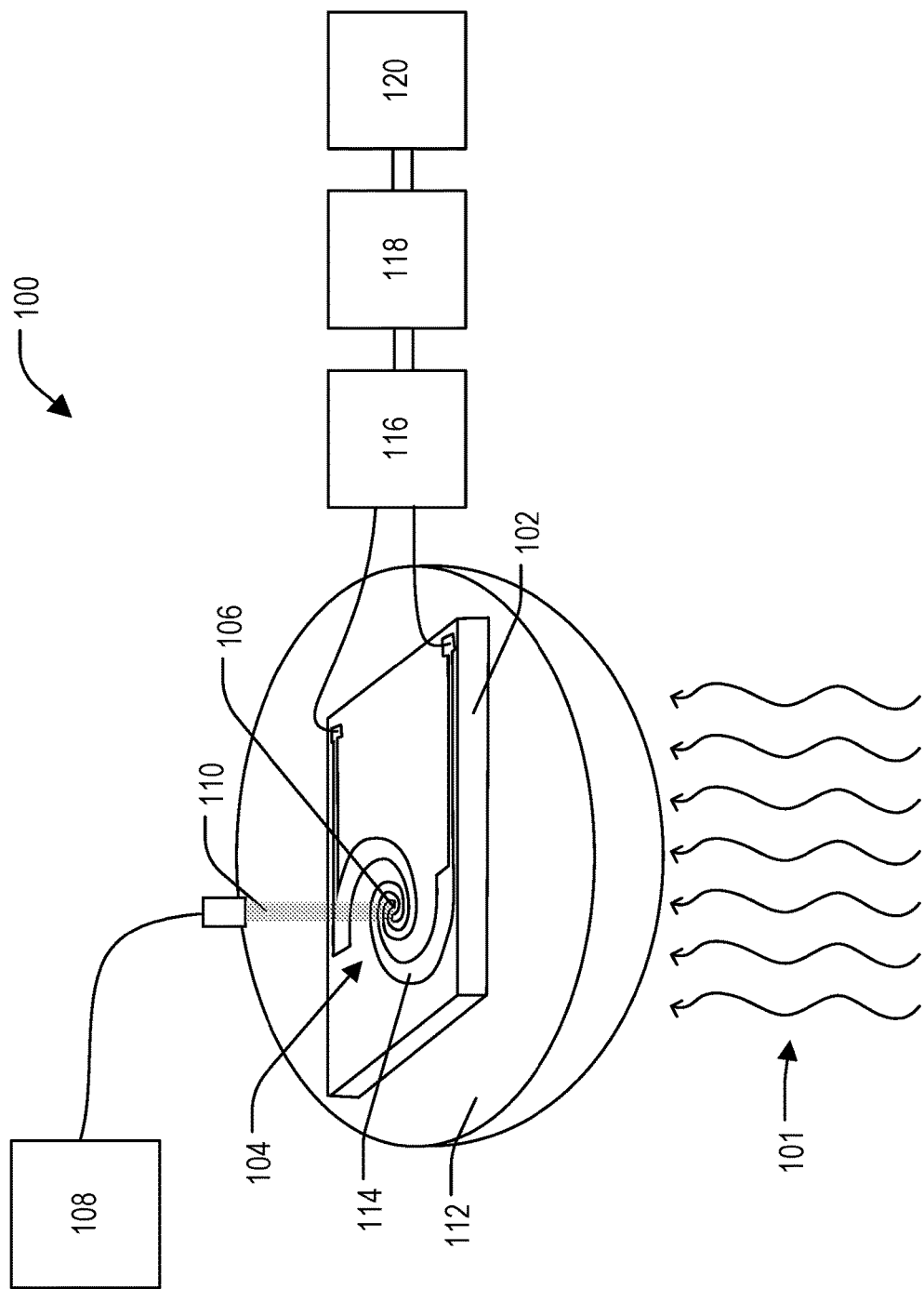
FIG. 1 depicts a system for detecting high-frequency radiation in accordance with the present disclosure.

FIG. 1 depicts a system 100 for detecting high-frequency radiation 101. In this illustration, optical beam 110 is depicted with shading for clarity reasons. The system 100 includes a substrate 102 made of a semiconductor material and having a contact-semiconductor interface 104. A photomixer 106 contacts the substrate 102 and is positioned at the contact-semiconductor interface 104. An optical pump 108 is configured to produce an optical beam 110 that has a terahertz beat frequency. The optical beam 110 contacts the contact-semiconductor interface 104.

The system may further comprise additional components to assist in the detection and measurement of the terahertz radiation 101. One such component is an optical lens 112 in contact with the substrate 102. The optical lens 112 may be configured to focus the terahertz radiation 101 onto the contact-semiconductor interface 104. A pair of antenna 114 may contact the photomixer 106 and be electrically connected to a power detector 120. An amplifier 116 and a bandpass filter 118 may be present between the antennas 114 and the power detector 120.

In the system and method of the present disclosure, the substrate may be made of a semiconductor material such as gallium arsenide, In(x)Ga(1−x)As(y)Sb(1−y), In(x)Ga(1−x)N, InP, Si, Ge, SiGe, or graphene. Alternatively, the substrate may be made of a different semiconductor material known in the art. For example, the substrate may contain titanium, chromium, gold, silver, platinum, or a similar material. The semiconductor material may be two dimensional (2D). For example, the substrate may be formed from graphene. The semiconductor material may have photo-absorbing properties. The semiconductor material may have a short carrier lifetime, such as a carrier lifetime of about 0.3 ps or less. The substrate may be doped in order to adjust material properties such as resistivity.

The photomixer may be a plasmonic photomixer with plasmonic contact electrodes. The electrodes may be two nanoscale gratings. The gratings may be made of a tin/gold alloy. The dimensions of these nanoscale gratings may be chosen to enhance the optical pump intensity at the contact-semiconductor interface through the excitation of surface plasmon waves. The contact-semiconductor interface may be coated with an anti-reflection coating to enhance the optical pump intensity. The anti-reflection coating may be silicon nitride. The plasmonic contact electrode gratings may be designed to cover a roughly 10×10 µm² active area with a tip-to-tip gap of about 1 µm. This active area may also define the area of the contact-semiconductor interface.

Using such a plasmonic gratings configuration may allow for an optical power transmission above 80% and a strong plasmonic enhancement when excited by the optical pump beam. The optical pump beam may have a wavelength of about 800 nm wavelength. However, additional wavelengths can be used depending on the photomixer and substrate compositions and configurations.

The optical pump may be any device capable of producing a heterodyning optical beam with a terahertz beat frequency. For example, the optical pump may be two distributed feedback (DFB) lasers, dual-wavelength lasers, frequency-comb lasers, and the like. The spectral bandwidth may be limited by the wavelength tuning range of the optical pump.

The lens may be used to focus the high-frequency radiation towards the contact-semiconductor interface. The lens may be a convex lens or another system capable of focusing the high-frequency radiation. The lens may be specifically made of silicon. The lens may have a diameter of at least 5, 10, 12, or 15 mm. The lens may be contacting, supporting, and/or connected to the substrate.

The antennas may be electrically connected to the photomixers. If the photomixer includes two plasmonic gratings, one antenna may be attached to each grating. The antennas may be logarithmic spiral antennas, dipole antennas, bow-tie antennas, a folded dipole antennas, combinations thereof, or the like. The frequency range of the extracted high-frequency spectrum may be determined by the antenna bandwidth. The antennas may be designed to have a negligible resistance over the frequency range of the high-frequency radiation to be measured.

After the high-frequency radiation is downconverted at the photomixer the IF signal may pass through additional electrical components before being measured. For example, the IF signal may pass through a low-noise amplifier in electrical communication with the antennas. Further, the IF signal may pass through a bandpass filter. Passing the signal through a bandpass filter allows the received high-frequency spectrum to be resolved with a high spectral resolution determined by the bandwidth of the bandpass filter and the linewidth of the optical pump beam. The signal may be finally measured using a power detector or an alternative detection system known in the art.

Figure 2:
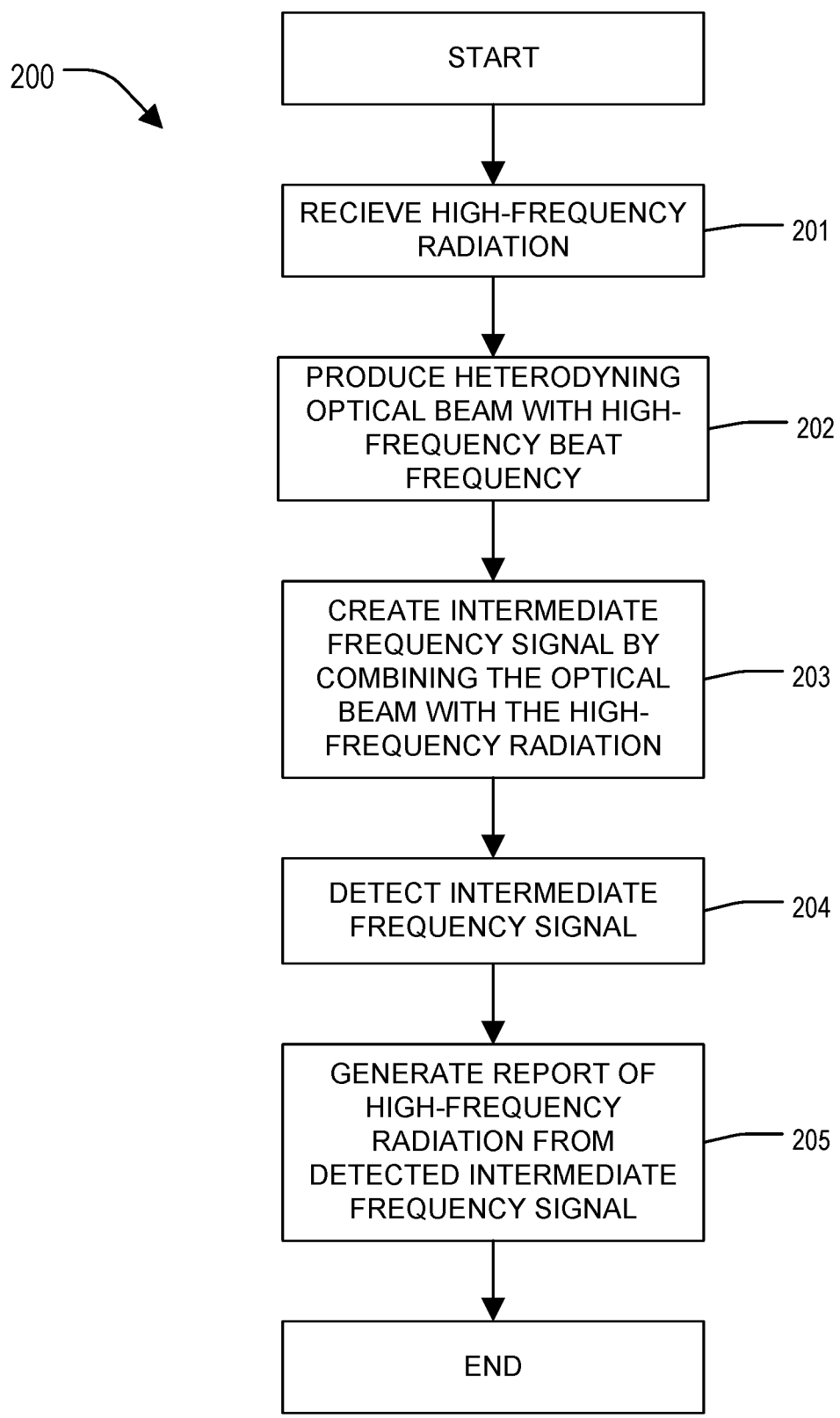
FIG. 2 depicts some a process flowchart of a method for detecting high-frequency radiation in accordance with the present disclosure.

FIG. 2 depicts a flowchart 200 for a method for detecting high-frequency radiation. The method includes the steps of receiving high-frequency radiation using a lens 201; producing a heterodyning optical beam that has a high-frequency beat frequency using an optical pump 202; creating an intermediate frequency signal by combining the optical beam with the high-frequency radiation using a photomixer 203; detecting the intermediate frequency signal 204; and generating a report of the high-frequency radiation from the detected intermediate frequency signal 205.

The intermediate frequency signal may have a frequency between 10 megahertz and 50 gigahertz. The method step of receiving high-frequency radiation 201 may comprise focusing terahertz radiation using a lens. The heterodyning optical beam may be produced by two distributed feedback lasers, dual-wavelength lasers, or frequency-comb lasers. The method 200 may further comprise passing the intermediate frequency signal through a low-noise amplifier before undergoing detection. The method 200 may further comprise passing the intermediate frequency signal through a bandpass filter before undergoing detection. A spectral bandwidth of the high-frequency radiation received is determined by the high-frequency beat frequency tuning range. The method 200 may further incorporate any of the components or techniques provided for the system 100 described herein.

Figure 3:
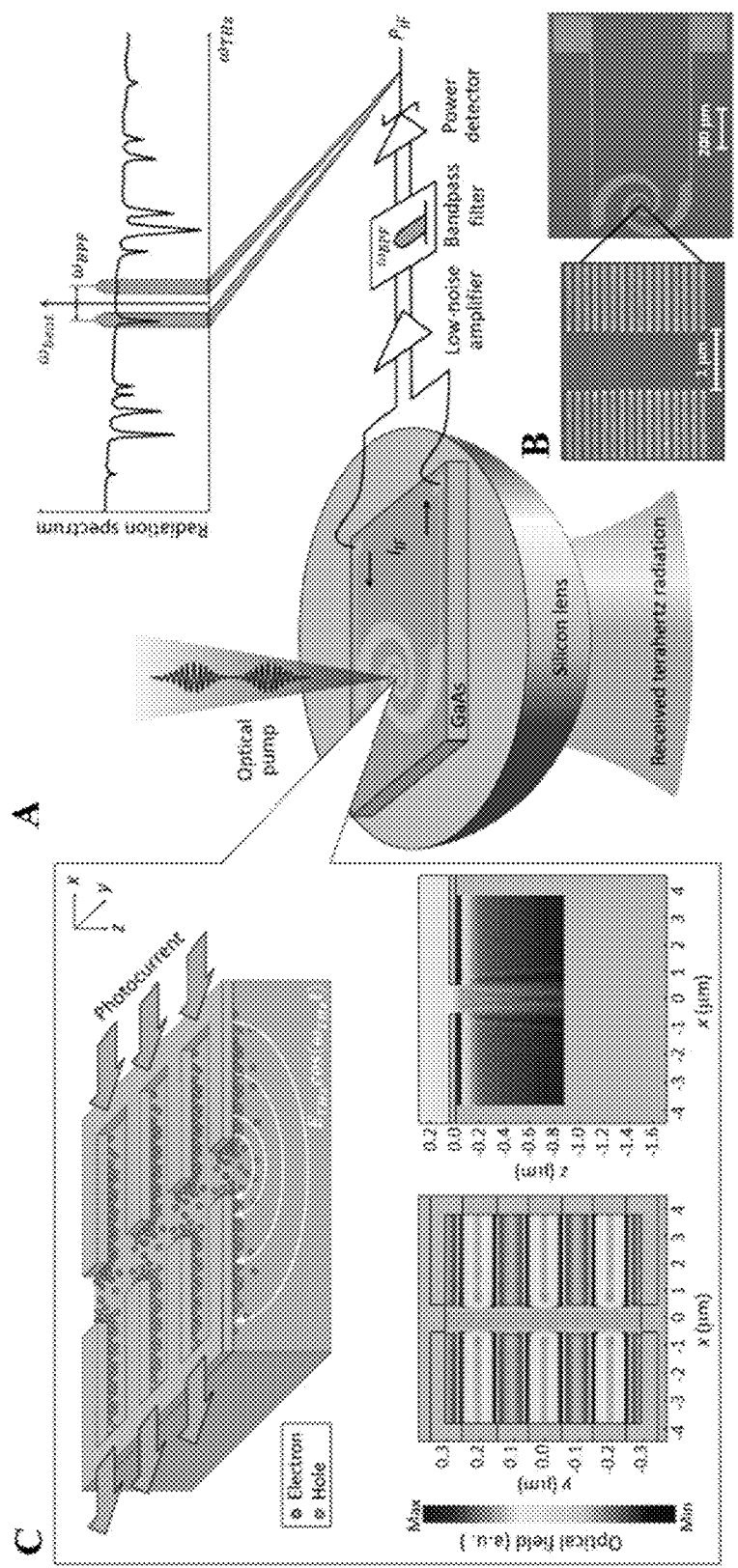
FIG. 3 depicts an experimental system for detecting high-frequency radiation. In section A, the plasmonic photomixer is pumped by a heterodyning optical beam with a terahertz beat frequency (beat); the received terahertz radiation is downconverted to an intermediate frequency (IF) current which can be easily detected by RF electronics. In section B, a scanning electron microscopy image of a fabricated plasmonic photomixer prototype is depicted. In section C, a magnified view of the experimental plasmonic photomixer is depicted.

In one version of the system and method of the present disclosure, the photomixer may be pumped with a heterodyning optical beam having a terahertz beat frequency, $\omega_{beat}$. Therefore, the concentration of the photo-generated carriers can follow the intensity envelope of the optical pump beam, $P_{pump}[1+\cos(\omega_{beat}t)]$. When a high-frequency radiation at $\omega_{THz}$ is received by a logarithmic spiral antenna a terahertz electric field may be induced across the photomixer contact electrodes, $E_{THz}\cos(\omega_{THz}t)$, which can drift the photo-generated carriers. The induced drift photocurrent may contain an intermediate frequency (IF) component at $|\omega_{beat}-\omega_{THz}|$, which falls in the radio frequency (RF) range by appropriately selecting the pump beat frequency. The induced IF signal may then be routed through a low-noise amplifier and a bandpass filter and before being detected by an RF power detector, as illustrated in FIG. 3, section A. The detected RF power carries the received spectral information at $\omega_{beat}+\omega_{BPF}$ over a spectral bandwidth equal to the bandwidth of the bandpass filter. By tuning the optical pump beat frequency and recording the detected power, the received high-frequency spectrum may be extracted over a broad frequency range determined by the logarithmic spiral antenna bandwidth. Moreover, the received high-frequency spectrum can be resolved with a high spectral resolution determined by the bandwidth of the bandpass filter and the linewidth of the optical pump beam. In this version, the described spectrometer operates in a double sideband (DSB) mode of observation, where the spectral information of the desired high frequency at $\omega_{beat}-\omega_{BPF}$ is measured together with that of the image frequency, $\omega_{beat}+\omega_{BPF}$.

One advantage of the terahertz spectrometer described herein is its ability to operate at or near room temperature while still offering near-quantum-limited sensitivity, broad spectral bandwidth, and high spectral resolution. The operating temperature of the spectrometer may be between 2 mK and 1500 K, and, further, may be above −20, −10, 0, 10, or 20 degrees Celsius. The operating temperature may be between 20 and 30 degrees Celsius.

EXAMPLES

The following non-limiting examples are provided in order to demonstrate and further illustrate certain embodiments and aspects of the present disclosure and are not to be construed as limiting the scope of the disclosure.

Example 1

An experimental system was developed in accordance with FIG. 3 in order to study the effectiveness of such a terahertz spectrometer.

The plasmonic photomixer was fabricated on a LT-GaAs substrate. The fabrication process started with patterning two plasmonic contact electrode gratings, by electron beam lithography, followed by Ti/Au (5/45 nm) deposition and liftoff. A 300-nm-thick $Si_3N_4$ anti-reflection coating layer was then deposited using plasma-enhanced chemical vapor deposition. Then, two contact vias were patterned by optical photolithography and etched through the $Si_3N_4$ layer by dry plasma etching. Finally, the logarithmic spiral antenna, IF transmission line, and bonding pads were patterned using optical photolithography, followed by Ti/Au (50/400 nm) deposition and liftoff. The fabricated plasmonic photomixer was mounted on a silicon lens (1.2 cm in diameter) glued onto a printed circuit board (PCB) with an SMA connector. The device output pads were bonded to the leads of the SMA connector to extract the IF output signal. The PCB was placed on a rotation mount to enable optical pump polarization adjustments. The silicon lens was glued to a tapered metallic cylinder (inner/outer diameter of 1.5/4.5 cm and length of 2.5 cm) to assist radiation coupling at wavelengths comparable to or larger than the silicon lens dimensions.

Figure 7:
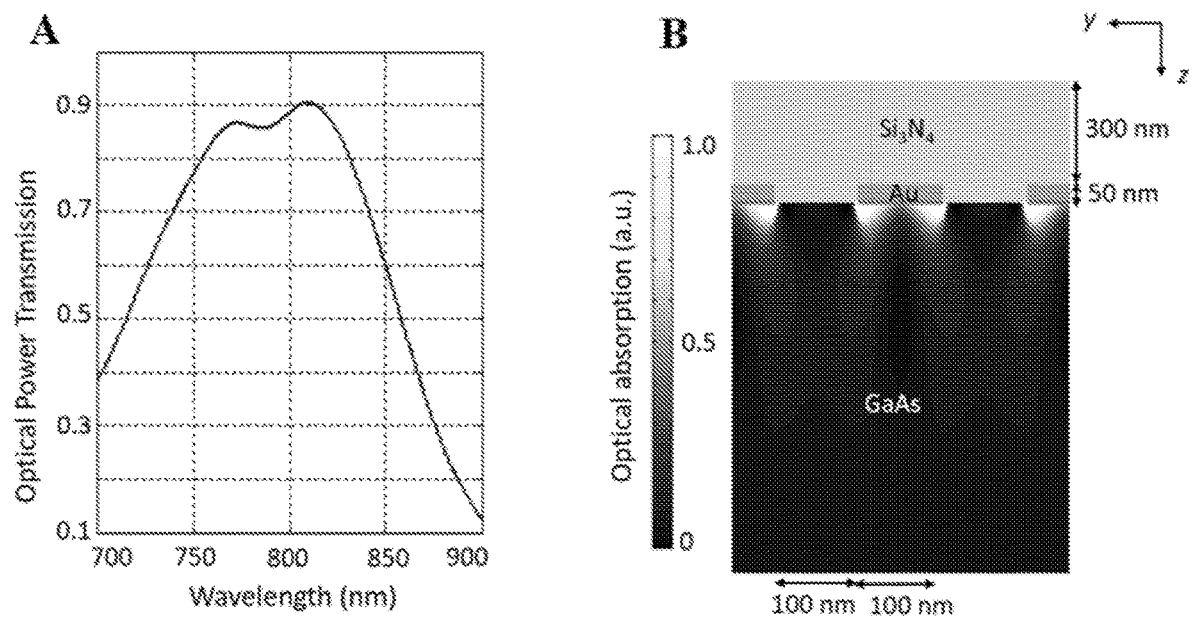
FIG. 7 depicts results of the experiment of Example 1 for optical interaction with the designed plasmonic gratings. Section A depicts power transmission of a y-polarized optical beam through the nanoscale gratings into the LT-GaAs substrate. Section B depicts optical power absorption inside the LT-GaAs substrate at a 784 nm wavelength.

Numerical simulations of the designed plasmonic gratings were performed using a finite-element-method-based electromagnetic software package (COMSOL) in order to characterize the interaction of the optical pump with the designed nanoscale Ti/Au gratings. These designed gratings had a 50 nm thickness, 200 nm pitch, 100 nm spacing, and 300 nm thick $Si_3N_4$ anti-reflection coating. FIG. 7, section A shows the power transmission of a y-polarized optical pump through the nanoscale gratings into the LT-GaAs substrate, predicting an optical power transmission of 85% at a roughly 784 nm optical wavelength. Since the optical transmission through the plasmonic gratings is accompanied by the excitation of surface plasmon waves, a large fraction of the photo-generated carriers is concentrated in close proximity to the contact electrode, as illustrated in FIG. 7, section B.

Figure 8:
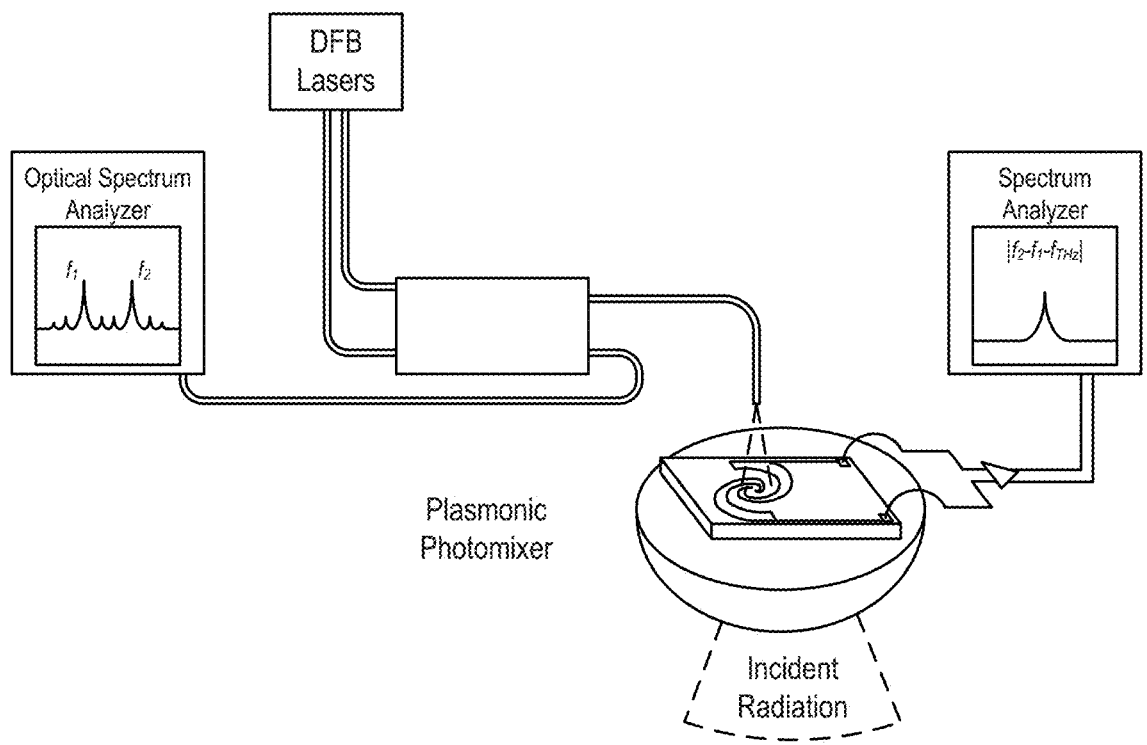
FIG. 8 depicts an experimental setup used for characterizing the operation of the fabricated plasmonic photomixer as a heterodyne high-frequency spectrometer.

The operation of the fabricated plasmonic photomixer as a heterodyne terahertz spectrometer was characterized in response to radiation from a×2×3 frequency multiplier chain developed at JPL for Herschel mission that upconverts the frequency of a Gunn oscillator (Millitech GDM-10 SN224) to 0.55 THz. To provide the heterodyning optical pump beam, the outputs of two wavelength-tunable, distributed-feedback (DFB) lasers with center wavelengths of 783 nm and 785 nm (TOPTICA #LD-0783-0080-DFB-1 and #LD-07835-0080-DFB-1) were combined and amplified (Toptica BoosTA Pro) to provide a tunable optical beat frequency from 0.1 to 2 THz. The IF output of the plasmonic photomixer was amplified using a low-noise amplifier (Mini-Circuits ZRL-1150) and monitored by an electrical spectrum analyzer. The schematic diagram of the experimental setup is shown in FIG. 8.

Figure 9:
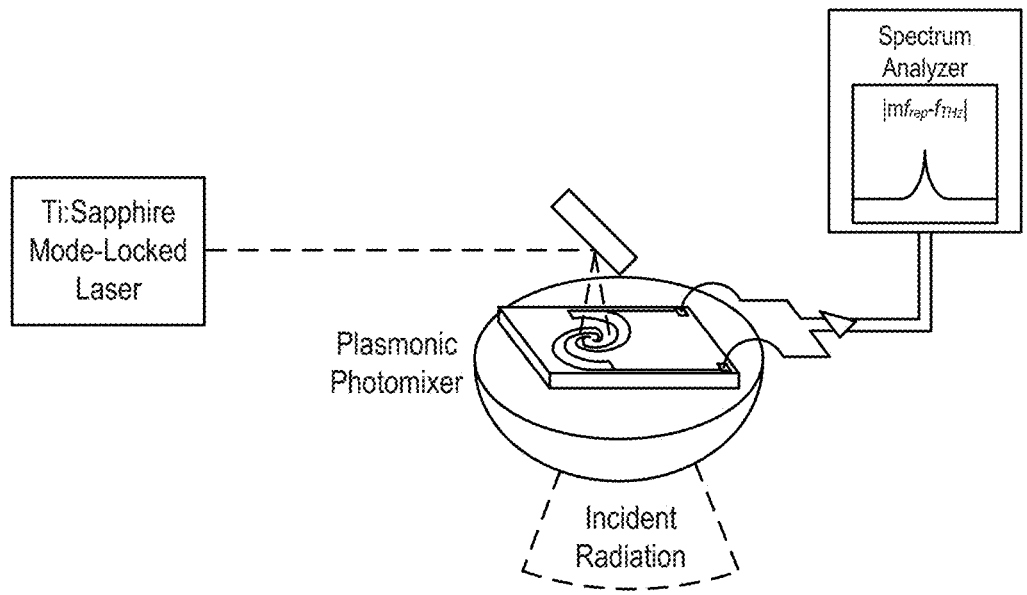
FIG. 9 depicts an experimental setup used for measuring the linewidth and stability of the introduced high-frequency spectrometer.

To investigate the impact of the optical pump linewidth on the spectral resolution of the presented spectrometry system, a highly stable optical comb from a Ti:sapphire mode-locked laser with a comb spacing of 78 MHz is used as the optical pump beam. The schematic diagram of the experimental setup is shown in FIG. 9.

Figure 11:
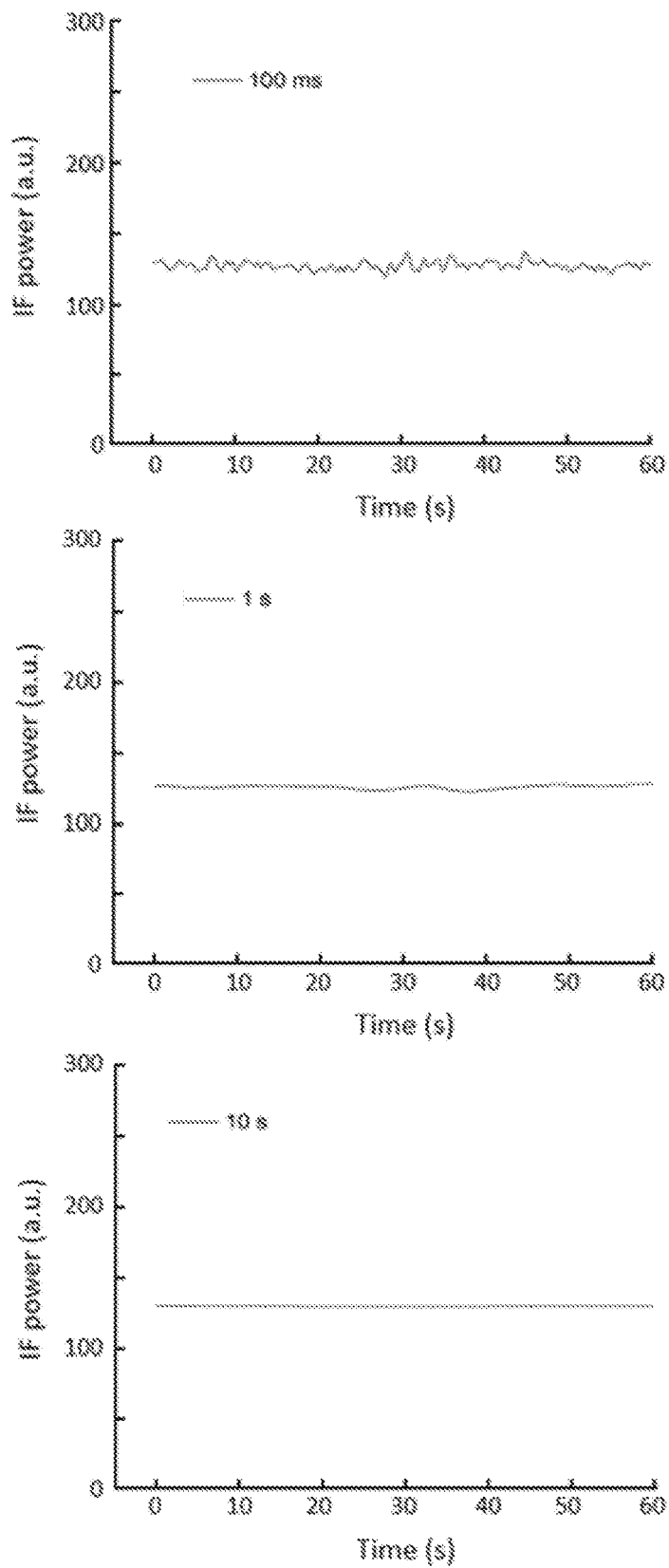
FIG. 11 depicts results of the experiment of Example 1 for the impact of the integration time on the spectrometer accuracy. The recorded IF power at 0.8 THz over a 60 second timeframe while using a 1500 K load shows a significant reduction in signal fluctuations caused by optical pump power variations when increasing the integration time from 100 ms to 1 s.

The plasmonic photomixer sensitivity was characterized using the Y-factor method, which measures the IF response of the plasmonic photomixer to the input noise sources from hot and cold loads. Calibrated blackbody (IR-564 from Boston Electronics) and Globar sources (Thorlabs—SLS203L) were used to provide the thermal loads in the 295-1500 K range. The optical pump beam from the dual DFB laser system was modulated using an acousto-optic modulator (Gooch & Housego AOMO 3080-125) at a 100 kHz rate, and the output IF signal at ~1 GHz is detected by a power meter (Mini-Circuits ZX47-60LN) using a lock-in amplifier with the 100 kHz modulation reference frequency and a 1 second time-constant/integration time (FIG. 11). A low-noise amplifier (Mini-Circuits ZRL-1150) and a band-pass filter (Mini-Circuits ZVBP-909) with a 15 MHz bandwidth are used to further condition the IF signal before the power meter. The measurements are performed in air, without the use of any vacuum or purging. The schematic diagram of the experimental setup is shown in FIG. 9.

FIG. 3, section B shows a scanning electron microscopy image of a fabricated plasmonic photomixer prototype. A short carrier lifetime semiconductor was used as the photo-absorbing substrate (i.e., a low-temperature-grown GaAs substrate with a 0.3 ps carrier lifetime) to recombine the slow photocarriers that degrade the THz-to-RF conversion efficiency. To achieve a broad spectral bandwidth, the geometry of the logarithmic spiral antenna was chosen to offer a radiation resistance of ~70Ω and a negligible reactance over the 0.1-5 THz frequency range. To achieve high THz-to-RF conversion efficiencies, two nanoscale Ti/Au gratings were used as the photomixer contacts, and their dimensions were chosen to enhance the optical pump intensity at the contact-semiconductor interface through the excitation of surface plasmon waves, as illustrated in FIG. 3, section C. As a result, a large fraction of the photo-generated carriers were concentrated in close proximity to these contacts, termed plasmonic contacts. Without being bound by theory, by reducing the average transport path length of the photo-generated carriers to the contact electrodes, a larger number of the photocarriers drift to the contact electrodes in response to an induced terahertz electric field, and higher THz-to-RF conversion efficiencies are achieved.

Figure 4:
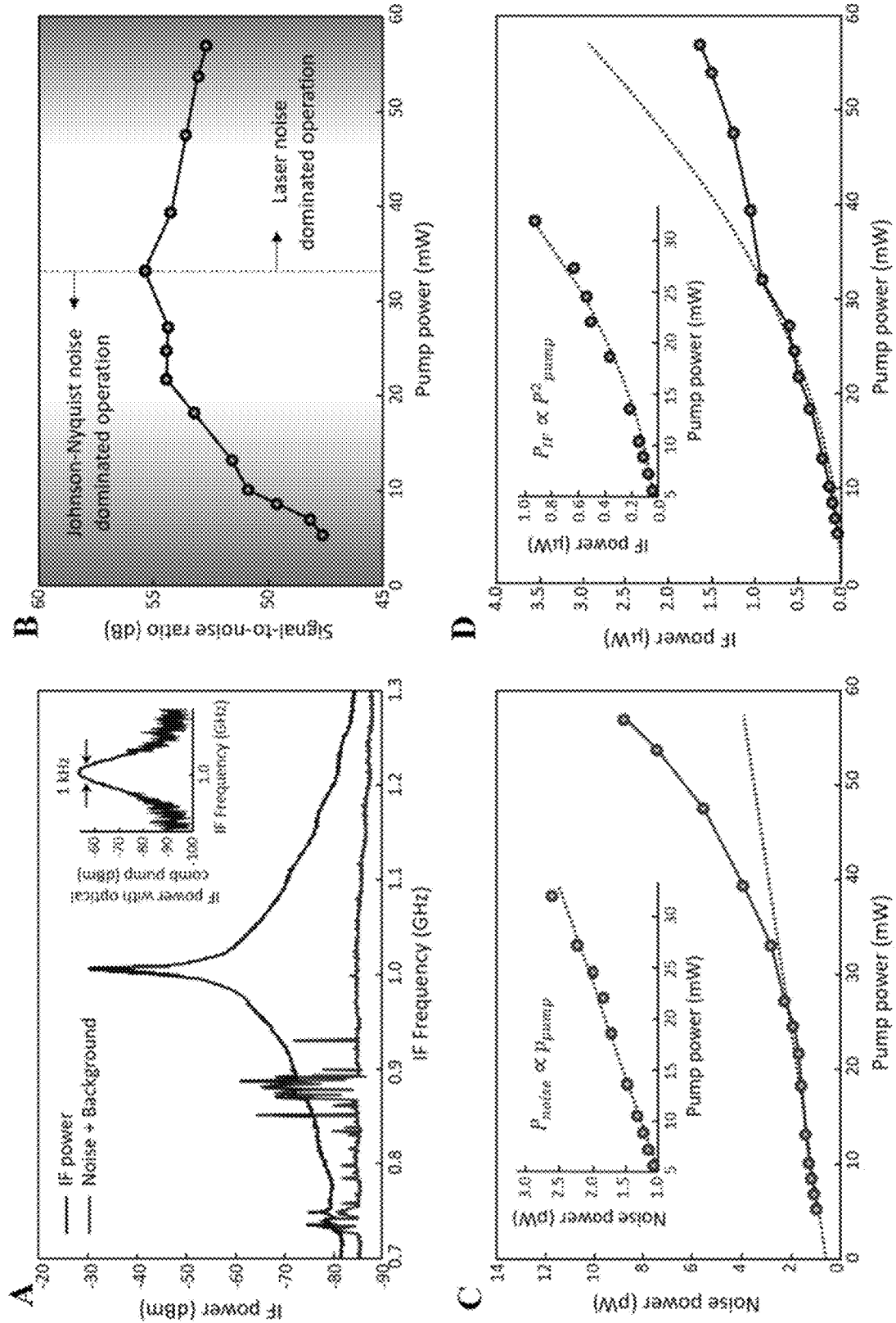
FIG. 4 depicts graphical results for the experiment of Example 1. Section A depicts the downconverted IF spectrum from 0.55 THz to 1 GHz (blue curve) and the IF noise/background in the absence of the 0.55 THz source (red curve) at a 33 mW optical pump power from two DFB lasers. The inset shows the IF spectrum when an optical comb from a Ti:sapphire mode-locked laser is used as the optical pump beam. The measured IF SNR, noise power, and signal power as a function of the optical pump power are shown in sections B, C, and D, respectively. A tunable attenuator was used to vary the optical pump power in these measurements. The IF noise and signal powers show a linear and quadratic dependence on the optical pump power below 33 mW, as illustrated in sections C and D, insets with R-squared fits of 98.5% and 99.1%, respectively.

The operation of the fabricated plasmonic photomixer as a heterodyne terahertz spectrometer was characterized at 0.55 THz (FIG. 8). Two wavelength-tunable, distributed-feedback (DFB) lasers were used to provide the heterodyning optical pump beam. FIG. 4, section A shows the observed IF spectrum centered at 1 GHz (blue curve) and the noise/background spectrum in the absence of the terahertz radiation (red curve). The lower spectral peaks observed near 750 MHz and 900 MHz were the background radio signals picked up by the IF transmission lines and cables. The observed IF signal had a linewidth of ~3 MHz, which was dominated by the linewidth of the two DFB lasers that provide the heterodyning optical pump beam. To investigate the impact of the optical pump linewidth on the spectral resolution of the presented terahertz spectrometry system, a highly stable optical comb from a Ti:sapphire mode-locked laser is used as the optical pump beam (Materials and Methods and FIG. 9). The observed spectrum near 1 GHz (FIG. 4, section A inset) had a linewidth of 1 kHz FWHM, which was dominated by the linewidth of the 0.55 THz source. Therefore, the fabricated plasmonic photomixer enabled terahertz spectrometry with resolutions less than 1 kHz, similar to the spectral resolution of conventional terahertz spectrometry systems.

The impact of the optical pump power on the sensitivity and dynamic range of the plasmonic photomixer is analyzed by recording the IF signal and noise power levels at different optical pump powers. FIG. 4, section B shows the measured IF SNR (the ratio between the IF signal and noise powers) as a function of the optical pump power, indicating a linear increase in the SNR at optical powers below 33 mW and a reduction in the SNR at optical powers above 33 mW. Without being bound by theory, this trend can be explained by different physical mechanisms affecting the photomixer noise and photocarrier dynamics inside the device active area. At low optical pump powers, the device noise may be dominated by the Johnson-Nyquist noise. Therefore, the IF noise power, which is inversely proportional to the photomixer resistance, increases linearly as a function of the optical pump power. The laser noise becomes more dominant at high optical pump powers, increasing the rate of the IF noise growth as a function of the optical pump power, as illustrated in FIG. 2, section C. On the other hand, the IF signal power, which is quadratically proportional to the induced drift photocurrent, increases quadratically as a function of the optical pump power at low optical pump powers. The carrier screening effect becomes more dominant at high photocarrier concentrations, decreasing the rate of the IF signal growth as a function of the optical pump power, as illustrated in FIG. 4, section D.

Figure 5:
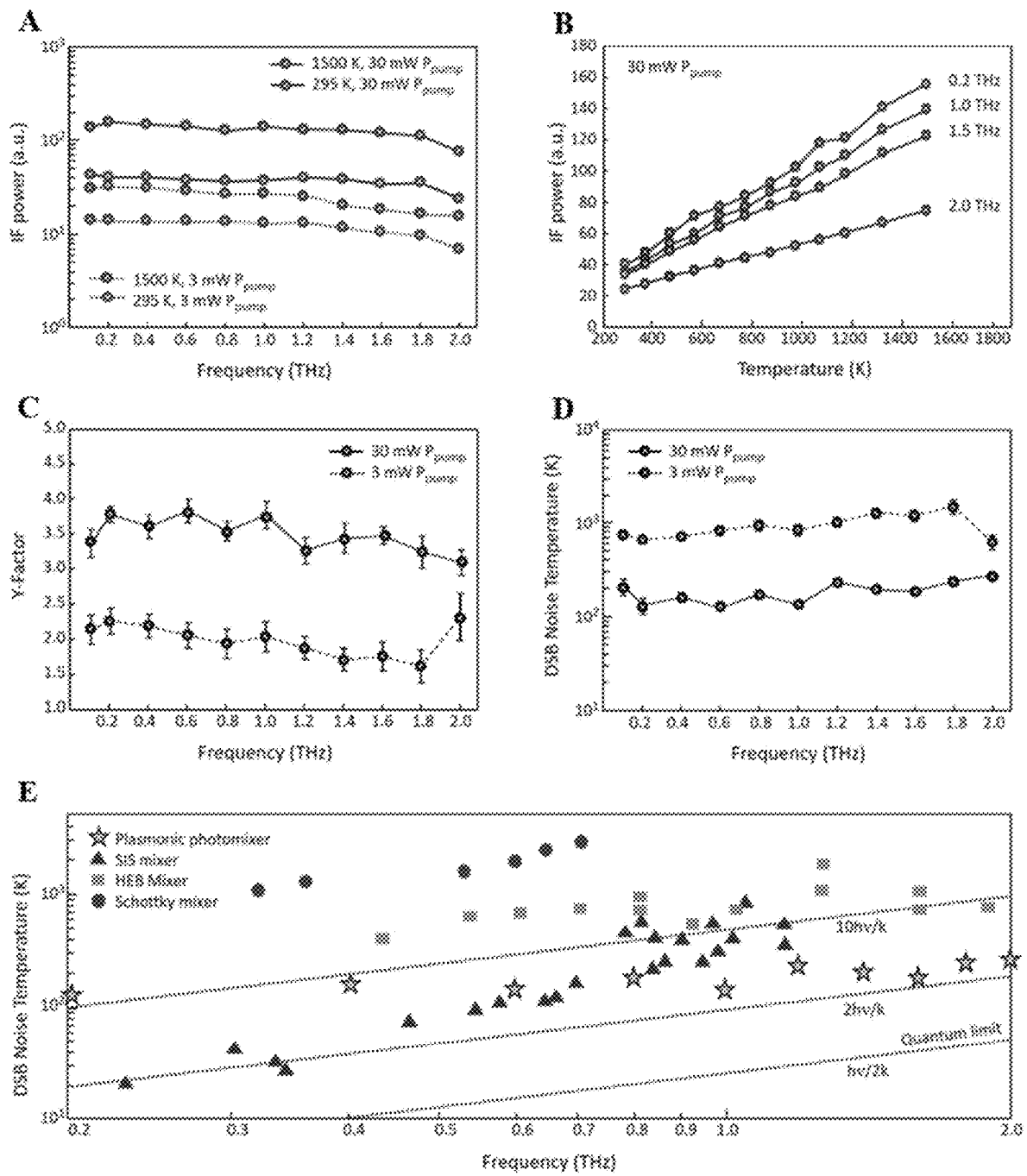
FIG. 5 depicts graphical results for the experiment of Example 1. Section A depicts the measured IF power in response to 1500/295 K hot/cold loads at 3 mW and 30 mW optical pump power over the 0.1-2 THz frequency range. Section B depicts the measured IF power in response to thermal loads in the 295-1500 K range at a 30 mW optical pump power. Section C depicts the Y-factor values calculated as the measured IF power at 1500 K ($P_{hot}$) divided by the measured IF power at 295 K ($P_{cold}$). Sections D depicts the DSB noise temperature values calculated as ($T_{eff,1500}$−Y.$T_{eff,295}$)/(Y−1), where $T_{eff,1500}$ and $T_{eff,295}$ are the equivalent temperatures of a blackbody at 1500 K and 295 K, respectively, according to the Callen-Walton definition. Section E depicts a comparison between the DSB noise temperature of the plasmonic photomixer with previously demonstrated Schottky mixers, HEB mixers, and SIS mixers used in conventional spectrometers.
Figure 10:
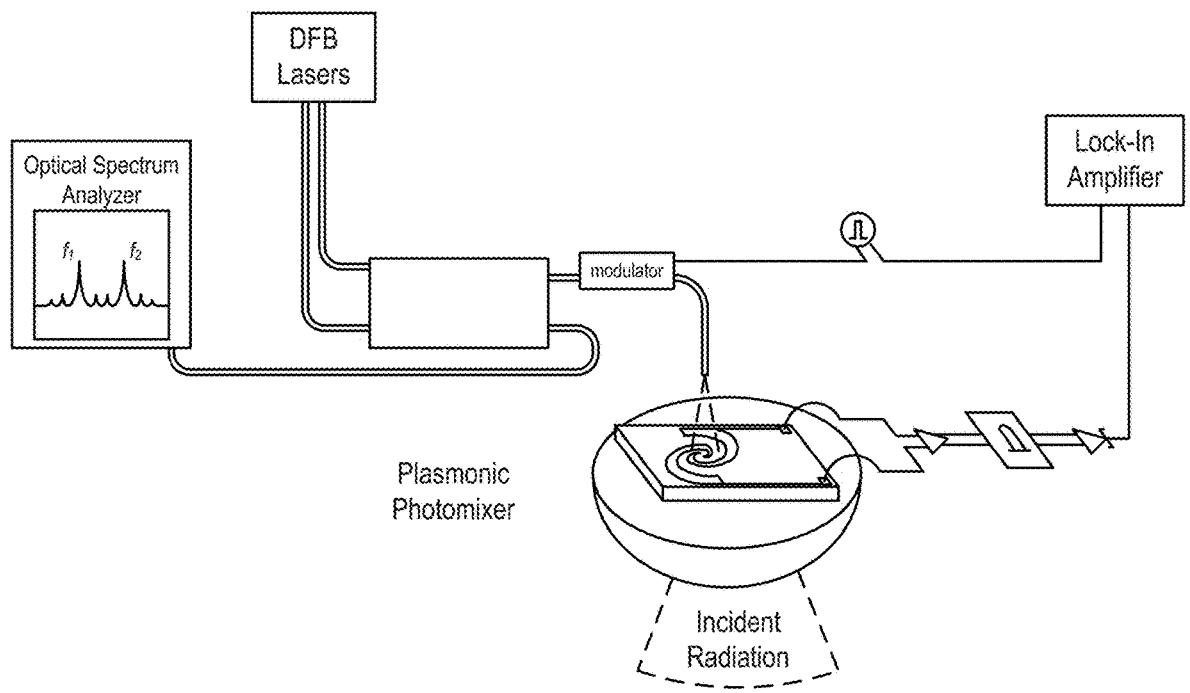
FIG. 10 depicts an experimental setup used for characterizing the sensitivity of the introduced high-frequency spectrometer.

The plasmonic photomixer sensitivity can be characterized using the Y-factor method, which measures the IF response of the plasmonic photomixer to input noise sources from hot and cold loads (FIG. 10). Unlike prior studies that use a single hot/cold load for Y-factor measurements, multiple hot/cold loads are used in our sensitivity analysis to simultaneously assess the spectrometer linearity. FIG. 5, sections A and B show the measured IF power in response to thermal loads varying between 295 K and 1500 K over the 0.1-2 THz frequency range. The results show that larger THz-to-RF conversion gains are achieved at higher optical pump powers since a larger number of photocarriers drift in response to the induced terahertz electric field inside the photomixer active area (FIG. 5, section A). As expected, a linear relation between the IF power and the load temperature is observed over the entire 295-1500 K range (FIG. 5, section B). The Y-factor and DSB noise temperature values are calculated from the measured IF powers at 1500/295 K hot/cold loads using the Callen-Walton effective hot/cold temperatures, as shown in FIG. 5, sections C and D, respectively. Although 1500 K and 295 K are used as the hot and cold loads, the linear dependence of the IF power on the load temperature (FIG. 5, section B) indicates that the same Y-factor and DSB noise temperature values can be achieved when using other hot/cold temperatures. DSB noise temperatures of 120-270 K are achieved in the 0.1-2 THz frequency range at a 30 mW optical pump power at room temperature. These DSB noise temperature values correspond to 20 and 4 times the quantum noise limit (hv/2 k) at 0.1 THz and 2 THz, respectively.

Figure 6:
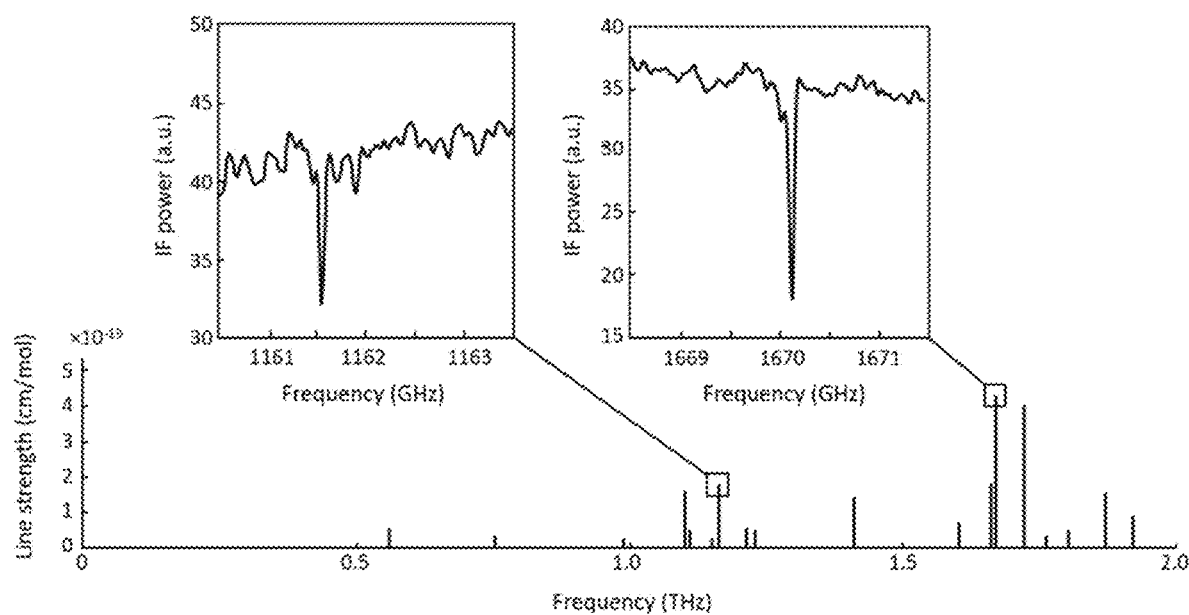
FIG. 6 depicts results of the experiment of Example 1 for water absorption lines resolved by the introduced spectrometer. Insets show the resolved spectra when the pump beat frequency is set near 1.16 THz or 1.67 THz.

FIG. 5, section E compares the DSB noise temperature of the fabricated plasmonic photomixer with previously demonstrated Schottky, HEB, and SIS mixers used in conventional heterodyne spectrometers in the 0.2-2 THz frequency range. This comparison indicates the superior performance of the presented plasmonic photomixer in offering noise temperatures lower than those of cryogenically cooled HEB mixers and SIS mixers at frequencies above 0.8 THz (down to 4 times that of the quantum noise limit) without the need of a terahertz local oscillator and while operating at room temperature. Remarkably, this unprecedented performance is achieved by a single plasmonic photomixer and optical pump beam with a beat frequency tunability of 2 THz. To achieve similar sensitivities and spectral bandwidths through conventional techniques, a large number of cryogenically cooled SIS mixers, HEB mixers, and terahertz local oscillators would be required. It should be noted that the sensitivity measurements were performed at frequencies away from the strong water absorption lines. By sweeping the beat frequency of the heterodyning optical pump beam and recording the IF power, water absorption lines matching the HITRAN database were resolved, as illustrated in FIG. 6.

The introduced terahertz spectrometry scheme opens new opportunities at the interface of quantum optics and terahertz photonics and offers a versatile experimental platform for different fundamental astronomical, cosmological, and atmospheric studies. The presented terahertz spectrometer is capable of offering broader spectral bandwidths exceeding 5 THz and the demonstrated spectral bandwidth of 2 THz is limited by the wavelength tuning range of the dual DFB lasers used to form the heterodyning optical pump beam. Moreover, the experimental terahertz spectrometer is capable of offering higher detection sensitivities at lower frequencies by using a larger diameter silicon lens, and the demonstrated detection sensitivity levels at lower frequencies is limited by the low radiation coupling to the utilized silicon lens with a 1.2 cm diameter. Additionally, the presented terahertz spectrometer is capable of offering even higher detection sensitivities by using a bandpass filter with a narrower bandwidth, ideally matching the linewidth of the heterodyning optical pump beam. The demonstrated sensitivity levels are limited by the 15 MHz bandwidth of the bandpass filter, which is substantially larger than the optical pump linewidth, but chosen to be slightly larger than the DFB laser beat frequency fluctuations. By using higher stability lasers and bandpass filters with narrower bandwidths, the spectrometer noise power level can be considerably reduced without impacting the signal power, thus, higher detection sensitivities can be achieved.

The present invention has been described in terms of one or more preferred embodiments, and it should be appreciated that many equivalents, alternatives, variations, and modifications, aside from those expressly stated, are possible and within the scope of the invention.

The invention claimed is:

1. A system for detecting high-frequency radiation, the system comprising:
    an antenna assembly configured to receive at least a high-frequency radiation of between 50 GHz and 10 THz, wherein the antenna assembly comprises a logarithmic spiral antenna having a negligible reactance over the 0.1-5 THz frequency range;
    a substrate comprising a semiconductor material with a contact-semiconductor interface connected to the antenna assembly;
    an optical pump configured to produce an optical beam that has a high-frequency beat frequency of between 0.1 THz and 2 THz, the optical beam contacting the contact-semiconductor interface to create an intermediate frequency signal in the radio frequency (RF) range by combining the optical beam with the high-frequency radiation;
    a bandpass filter in electrical communication with the antenna assembly, and configured to filter the intermediate frequency; and
    a detector configured to detect the filtered intermediate frequency and generate at least one report indicating the received, high-frequency radiation.

2. The system of claim 1, further comprising a photomixer configured to cooperate with the optical pump to create the intermediate frequency signal.

3. The system of claim 2, wherein the photomixer comprises plasmonic contact electrodes.

4. The system of claim 1, further comprising a lens configured to focus terahertz radiation received by the antenna assembly towards the photomixer.

5. The system of claim 1, wherein the bandpass filter has a bandwidth of 15 MHZ or narrower.

6. The system of claim 5, wherein a bandwidth of the bandpass filter matches a linewidth of the optical pump.

7. The system of claim 1, further comprising a low-noise amplifier in electrical communication with the antenna assembly.

8. The system of claim 1, wherein an operating temperature of the system is between 2 mK and 1500 K.

9. The system of claim 1, wherein the semiconductor material may include at least one of gallium arsenide, In(x)Ga(1−x)As(y)Sb(1−y), In(x)Ga(1−x)N, InP, Si, Ge, SiGe, or graphene.

10. The system of claim 1, wherein the optical pump comprises two distributed feedback lasers, dual-wavelength lasers, or frequency-comb lasers.

11. The system of claim 1, further comprising an anti-reflection coating positioned over the contact-semiconductor interface.

12. The system of claim 1, wherein the received, high-frequency radiation is within a range of 50 GHz-10 THz.

13. A method for detecting high-frequency radiation, the method comprising:

receiving high-frequency radiation of between 50 GHz and 10 THz using a lens and a logarithmic spiral antenna having a negligible reactance over the 0.1-5 THz frequency range;

producing a heterodyning optical beam that has a high-frequency beat frequency of between 0.1 THz and 2 THz using an optical pump;

creating an intermediate frequency signal in the radio frequency (RF) range by combining the optical beam with the high-frequency radiation using a photomixer;

passing the intermediate frequency signal through a bandpass filter;

detecting the filtered intermediate frequency signal; and generating a report of the high-frequency radiation from the detected filtered intermediate frequency signal.

14. The method of claim 13, wherein the intermediate frequency signal has a frequency between 10 MHz and 50 GHz.

15. The method of claim 13, wherein receiving high-frequency radiation comprises focusing terahertz radiation using a lens.

16. The method of claim 13, wherein the heterodyning optical beam is produced by two distributed feedback lasers, dual-wavelength lasers, or frequency-comb lasers.

17. The method of claim 13, further comprising passing the intermediate frequency signal through a low-noise amplifier before undergoing detection.

18. The method of claim 13, wherein the bandpass filter has a bandwidth of 15 MHz or narrower.

19. The method of claim 13, wherein a spectral bandwidth of the high-frequency radiation received is a function of the high-frequency beat frequency tuning range.

20. The method of claim 13, wherein a bandwidth of the bandpass filter matches a linewidth of the heterodyning optical pump.

* * * * *